(12) United States Patent
Schulz

(10) Patent No.: US 11,356,092 B2
(45) Date of Patent: Jun. 7, 2022

(54) CAPACITIVE SENSOR FOR THE AUTOMOTIVE SECTOR WITH A CHARGE AMPLIFIER

(71) Applicant: IFM ELECTRONIC GMBH, Essen (DE)

(72) Inventor: Jörg Schulz, Tettnang (DE)

(73) Assignee: IFM ELECTRONIC GMBH, Essen (DE)

(*) Notice: Subject to any disclaimer, the term of this patent is extended or adjusted under 35 U.S.C. 154(b) by 35 days.

(21) Appl. No.: 16/743,606

(22) Filed: Jan. 15, 2020

(65) Prior Publication Data
US 2020/0235734 A1    Jul. 23, 2020

(30) Foreign Application Priority Data

Jan. 21, 2019 (DE) ................ 10 2019 101 382.8

(51) Int. Cl.
| | |
|---|---|
| *H03K 17/96* | (2006.01) |
| *B60J 5/04* | (2006.01) |
| *G01D 5/24* | (2006.01) |
| *H03F 3/70* | (2006.01) |

(52) U.S. Cl.
CPC ............. *H03K 17/962* (2013.01); *B60J 5/04* (2013.01); *G01D 5/24* (2013.01); *H03F 3/70* (2013.01); *H03K 2217/96078* (2013.01); *H03K 2217/960725* (2013.01); *H03K 2217/960745* (2013.01)

(58) Field of Classification Search
CPC ..... H03K 17/962; H03K 2217/960725; H03K 2217/960745; H03K 2217/96078; H03K 2217/960775; H03K 17/955; B60J 5/04; G01D 5/24; H03F 3/70
See application file for complete search history.

(56) References Cited

U.S. PATENT DOCUMENTS

| | | | | |
|---|---|---|---|---|
| 2007/0216423 | A1* | 9/2007 | Grosjean | G01P 15/125 324/661 |
| 2010/0307840 | A1* | 12/2010 | Kobayashi | G06F 3/0445 178/18.06 |
| 2018/0136761 | A1* | 5/2018 | Jiang | G06F 3/0447 |

FOREIGN PATENT DOCUMENTS

| | | |
|---|---|---|
| DE | 19506134 B4 | 8/2005 |
| DE | 102013221346 B4 | 10/2015 |

* cited by examiner

*Primary Examiner* — Daniel R Miller
(74) *Attorney, Agent, or Firm* — Harness, Dickey & Pierce, P.L.C.

(57) ABSTRACT

Capacitive door handle sensor comprising at least one transmission electrode and a reception electrode, an operational amplifier configured as a charge amplifier and connected to the reception electrode, a switch for charge transfer, a first and a second switch for discharging the two operational amplifier inputs and, a capacitor arranged between the output and the inverting input of the operational amplifier, and a control unit for controlling and evaluating the measurement, wherein the control unit comprises a reference potential switching output which is connected to a terminal of the switch and is configured to selectively control a capacitance measurement between the transmission electrodes and the reception electrode or between the reception electrode and ground. Furthermore, methods for setting different operating modes are claimed.

10 Claims, 4 Drawing Sheets

CAPACITIVE SENSOR FOR THE AUTOMOTIVE SECTOR WITH A CHARGE AMPLIFIER

CROSS-REFERENCE TO RELATED APPLICATIONS

This application claims the benefit and priority of German Patent Application Serial No. 10 2019 101 382.8, filed Jan. 21, 2019. The entire disclosure of the above application is incorporated herein by reference.

FIELD

The invention relates to a capacitive door handle sensor comprising a charge amplifier, wherein a door handle sensor is to be understood as a sensor for opening a motor vehicle door by recognizing a human body part in particular a finger, a hand, or a foot. Operating elements in the automotive sector are often designed as capacitive sensors in door handles or operable zones at the tailgate or front flap in order to be able to detect an access attempt by the user. Such sensors have been used for a number of years and are manufactured and sold, among others, by the applicant. Since in addition to the capacitive sensors mentioned above also other functional modules are used in their immediate vicinity, near-field electromagnetic communication (NFC), radio or lighting units, to name only a few, they must meet high requirements in terms of their packing density, their space requirements and, above all, in terms of their energy demand. This in turn means that the sensory advantageous arrangements of electrode systems often can not be satisfactorily implemented because e.g. long feed lines or disturbing basic capacities severely restrict the function.

BACKGROUND

In the prior art, capacitive sensor circuits have been established, which are based on the principle of charge transport, because here the intelligent control by a microcontroller is particularly easy and flexible to implement. In this case, a transmitter-receiver measurement principle is used, in which only the capacitance between a transmission electrode and a reception electrode is measured, while the capacity of the transmission electrode against the reference potential does not contribute to the measured charge transport and thus has no effect on the measurement result, because under confined spatial conditions unwanted parasitic capacities are unavoidable. Space for larger electrodes with more measuring capacity is not available. Therefore, it can be very advantageous if the reception electrode, too, is capacitively insensitive to the reference potential. However, this can only be achieved if the receiver input has a virtual reference potential, that is to say essentially no voltage swing caused by the charge transport is generated, or if it is adjusted during the measurement.

Since such capacitive sensors usually deal with very small charges, a powerful amplifier stage is indispensable. In this case, the use of a charge amplifier configured with a commercial operational amplifier (OPV) is suggested, in which the non-inverting input is connected to a reference potential, while at the inverting input a virtual reference potential is set. The feedback is usually realized via a capacitance, wherein for each charge transfer at the input a voltage swing at the output is produced, which represents a measure of the charge quantity at the input for a known feedback capacitance.

A common problem of such sensor circuits based on the transmitter-receiver measurement principle, however, is the limitation in terms of evaluable electrode capacitances. Thus, due to the principle, only capacities which are formed between the transmission electrode and the reception electrode can be evaluated. However, it may be necessary to also evaluate electrode capacitances which are formed against the ground potential, for example if only a single sensor electrode can be provided for reasons of space, or if the relevant measured value is sensory relevant in addition to the measured values from the transmitter-receiver measuring principle. However, the evaluation of capacitances between a sensor electrode and the electrical ground potential is not possible with a measuring principle according to the transmitter-receiver principle or only with lossy restrictions. Known sensor systems are usually designed either for detecting ground-related capacitances or for detecting capacitances between the transmission electrode and the reception electrode.

From DE 19506134 B4 a charge amplifier comprising an additional downstream amplifier stage is known. The circuit can also be regarded as a capacitive sensor circuit, wherein the coupling capacitance at the input of the charge amplifier represents the capacitance to be measured according to the transmitter-receiver measurement principle. A ground-related capacitance measurement is not provided.

DE 10 2013 221346 B4 shows a front circuit for a capacitive sensor, in which different measurement modes for capacitance measurement can be set. A disadvantage is the fixed ground reference of the switch input capacitors, such that they also contribute to the capacitance measurement and negatively affect the measurement result.

SUMMARY

Thus, it is an object of the invention to provide a capacitive sensor circuit, which in addition to a low energy demand and substantial insensitivity to typical environmental influences such as moisture and dirt opens up the possibility to detect metrologically the concrete installation conditions, in particular the capacitive coupling of the reception electrode against the transmission electrodes as well as the capacitive load of the reception electrode against ground without additional effort, which requires at least two electronically switchable operating modes in order to allow an optimal adaptation to the respective requirements. The charge amplifier used in this case should be particularly inexpensive to implement and be realized with respect to various operating modes without the known disadvantages of the mentioned prior art. In addition, the circuit should be designed for a rapid processing of individual measurements.

The essential idea of the invention is to use a switch provided at the reception electrode, which in a "normal operation" serves to transfer charges, i.e. to scan the reception electrode, in further optional operating modes, wherein the reception electrode can then be used without a transmission electrode for a capacitance measurement against ground potential. For this purpose, the switch which is already connected to a switching output of the control unit, usually a microcontroller, is also designed to generate a charge transport from the reception electrode to ground, so that the capacitance measurement, now depending on the control, takes place not only between the transmission electrodes and the reception electrode, but also for inactive transmission electrodes between the reception electrode and ground.

DRAWINGS

The invention will be explained in more detail with reference to the drawing.

DETAILED DESCRIPTION

Figure 1:
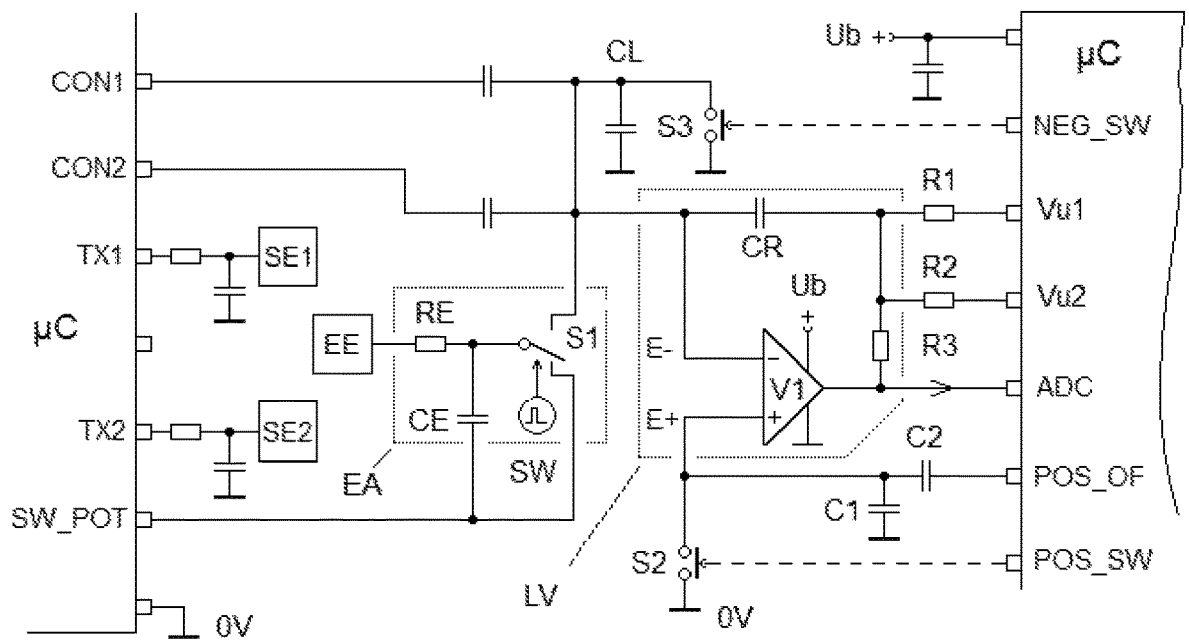
FIG. 1 shows a capacitive sensor circuit according to the invention with three electrodes.

FIG. 1 shows a capacitive sensor circuit comprising two transmission electrodes SE1, SE2 and one reception electrode EE. Individual measurements are provided, wherein prior to each individual measurement the charge amplifier LV should assume a defined initial state, which is the reference for the load to be measured. The two transmission electrodes SE1 and SE2 are supplied with transmitting pulses, which cause charge displacements on the reception electrode EE, by the switching outputs TX1 and TX2 of the microcontroller μC.

The receiver circuit is realized by an analog switch S1, which is turned simultaneously with or shortly before the edge of one or more transmission signals into a conductive state and therefore transmits a directed charge pulse to a charging capacitor CL. The amplification of the charge pulse occurs via the charge amplifier LV, which after a settling time provides at its output a voltage that can be digitized via an analog-to-digital converter, whose input is denoted by ADC, and processed as a digital reading.

The initialization of the charge amplifier LV is effected, as shown in the figure, by dissipating the charge stored in the feedback capacitor CR without requiring a switch element between the output of the operational amplifier V1 and its inverting input E−.

According to the invention, both the reference potential of the switch S1 and the input capacitor CE are connected to a reference potential switching output SW_POT, whereby the switching of the measurement modes between transmitter-receiver measurement and ground-related measurement is possible particularly simple and advantageous, merely by software.

In the case of a ground-related measurement, a charge transport additionally takes place between the reception electrode EE and the reference potential (ground). This may be desirable in some applications, e.g., if due to the design, only a single electrode can be made available, or if the relevant measured value is sensory relevant in addition to the measured values from the transmission-reception principle. By use of the transmission-reception principle, capacitances between the transmission electrode and the reception electrode can be evaluated, while in the ground-related measurement, capacitances between the reception electrode and ground (0V) are determined.

If the reference potential switching output SW_POT shown in FIG. 1 is permanently at LOW potential during a measurement according to the transmission-reception principle, then the useful signal arises only through a charge transport between the transmission and reception electrode.

In a ground-related measurement, a switching edge is generated at reference potential switching output SW_POT at the same time as the switch driving pulse, which switches its input capacitance and the electrical potential of the switch, while the utilization charge, which is still stored in the measuring capacitance between EE and ground, directly after the switch over of the switch is discharged into the storage capacity to be further processed there in the manner described above.

FIGS. 2 to 8 show seven preferred operating modes according to the invention. The time of (useful) charge transport is marked with a dashed line.

Figure 2:
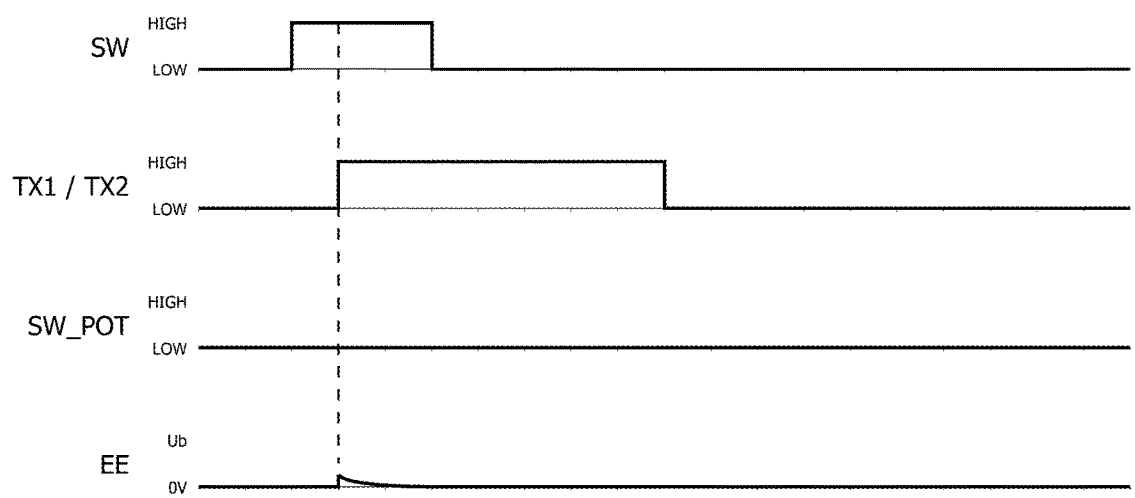
FIG. 2 shows the timing diagram of an operating mode with delayed TX edge and positive TX polarity.

FIG. 2 shows the timing diagram of a first operating mode with a delayed TX edge operating according to the transmission-reception principle (TX-RX mode). In this variant, disturbing gate propagation times or RC constants are ineffective due to an additional delay time during the measurement, so that lower demands are placed on the time regime, a less time-critical method.

The measurement is as follows:
switching output of the transmitter (TX1 and/or TX2) is LOW,
reference potential switching output (SW_POT) is LOW,
control signal (SW) for the switch (S1) is LOW,
control signal (SW) for the switch (S1) switches to HIGH,
expiration of a delay time,
switching output of the transmitter (TX1 and/or TX2) switches to HIGH,
control signal (SW) for the switch (S1) switches to LOW,
switching output of the transmitter (TX1 and/or TX2) switches to LOW.

Figure 3:
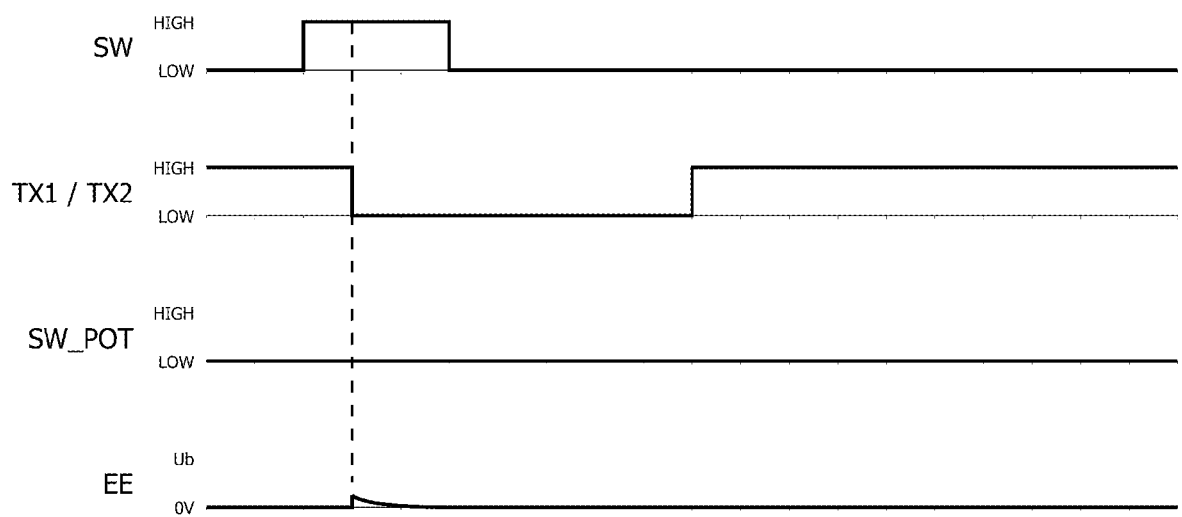
FIG. 3 shows the timing diagram of an operating mode with delayed TX edge and negative TX polarity.

FIG. 3 shows the timing diagram of a second TX-RX operating mode with delayed TX edge operating according to the transmission-reception principle (TX-RX mode). The TX signal has the opposite polarity with respect to FIG. 2. Both operating modes can advantageously be carried out directly one after the other in order to suppress undesired influencing factors, such as offset errors, by subtraction.

Figure 4:
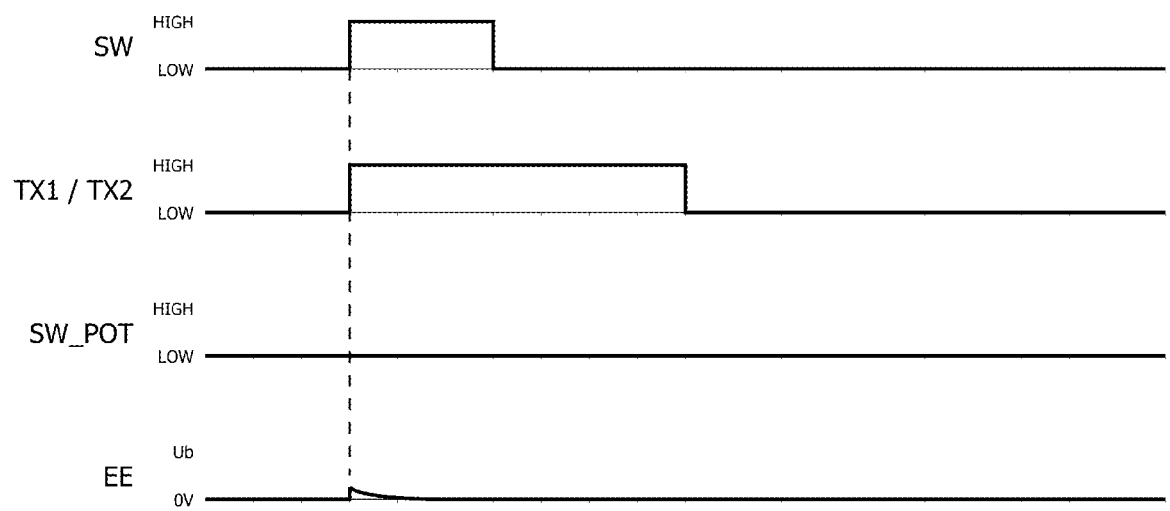
FIG. 4 shows the timing diagram of an operating mode with non-delayed TX edge and positive TX polarity.

FIG. 4 shows the timing diagram of a TX-RX (measurement) mode with non-delayed TX edge operating according to the transmission-reception principle. This variant has the same effect as the one shown above. It should be noted here that the switching states change fast enough before the charge is transferred from SE1 to EE, i.e. the RC time constants must not be shorter than the gate propagation time from the switch, otherwise this circuit will not work satisfactorily. Thus, an additional delay time was provided in the variants according to FIG. 2 and FIG. 3, so that their sequence is less time-critical.

The measurement is as follows:
switching output of the transmitter (TX1 and/or TX2) is LOW,
reference potential switching output (SW_POT) is LOW,
control signal (SW) for the switch (S1) is LOW,
control signal (SW) for the switch (S1) switches to HIGH and the switch output of the transmitter (TX1 and/or TX2) switches to HIGH,
control signal (SW) for the switch (S1) switches to LOW,
switching output of the transmitter (TX1 and/or TX2) switches to LOW.

Figure 5:
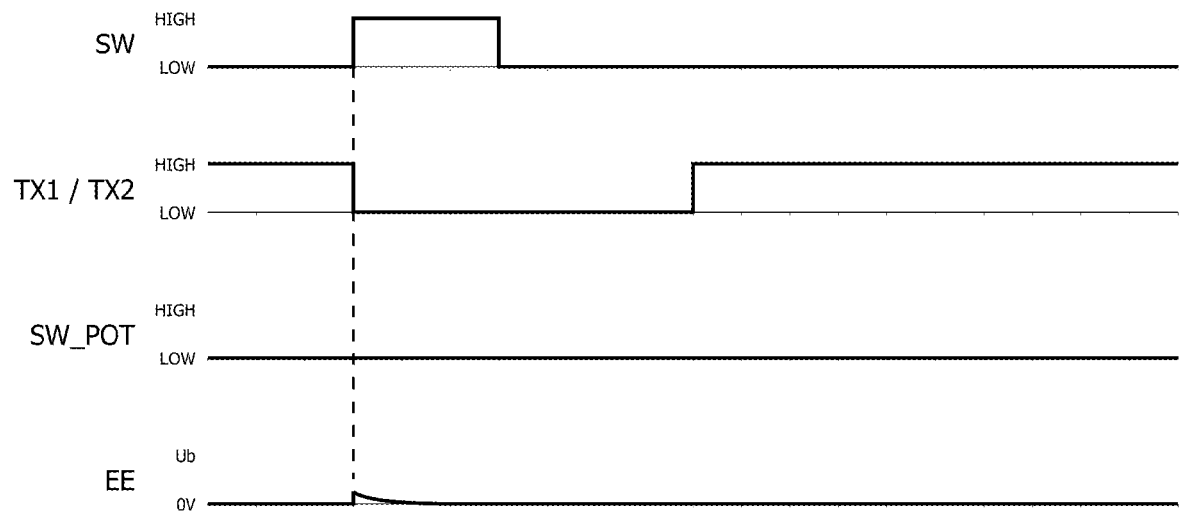
FIG. 5 shows the timing diagram of an operating mode with non-delayed TX edge and negative TX polarity.

FIG. 5 shows the timing diagram of another operating mode with non-delayed TX edge operating according to the transmission-reception principle (TX-RX mode). The TX signal has the opposite polarity with respect to FIG. 4. Both operating modes can advantageously be carried out directly one after the other in order to suppress undesired influencing factors, such as offset errors, by subtraction.

Figure 6:
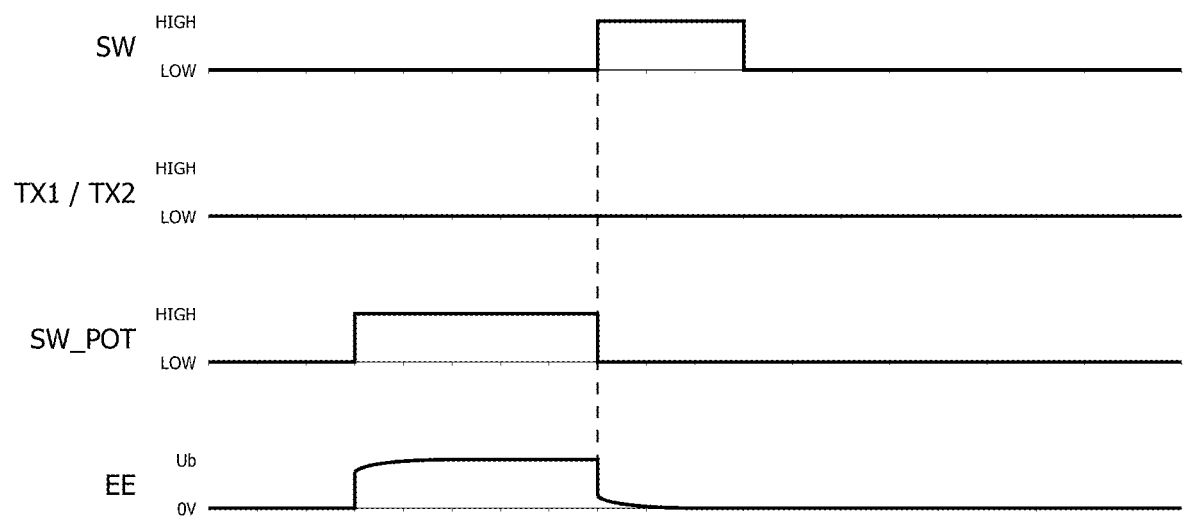
FIG. 6 shows the timing diagram for a ground-related capacitance measurement without TX activity.

FIG. 6 shows the timing diagram of an operating mode relating to the ground-related capacitance measurement (C-GND), wherein the reference potential of the input EA is switched simultaneously with the first edge of the switching signal denoted by SW in FIG. 1. The TX signal is inactive and permanently low. In the ground-related capacitance measurement at the reception electrode EE the gate propagation time of the switch S1 is deliberately used, so that the outputs SW and SW_POT must switch simultaneously. The charge transport to be used then takes place only after the delay through the RC element at the EA, while any undesired charge transport, for example by the input capacitance CE, is suppressed because the switch only switches after this switching edge with a delay of a few nanoseconds.

Figure 7:
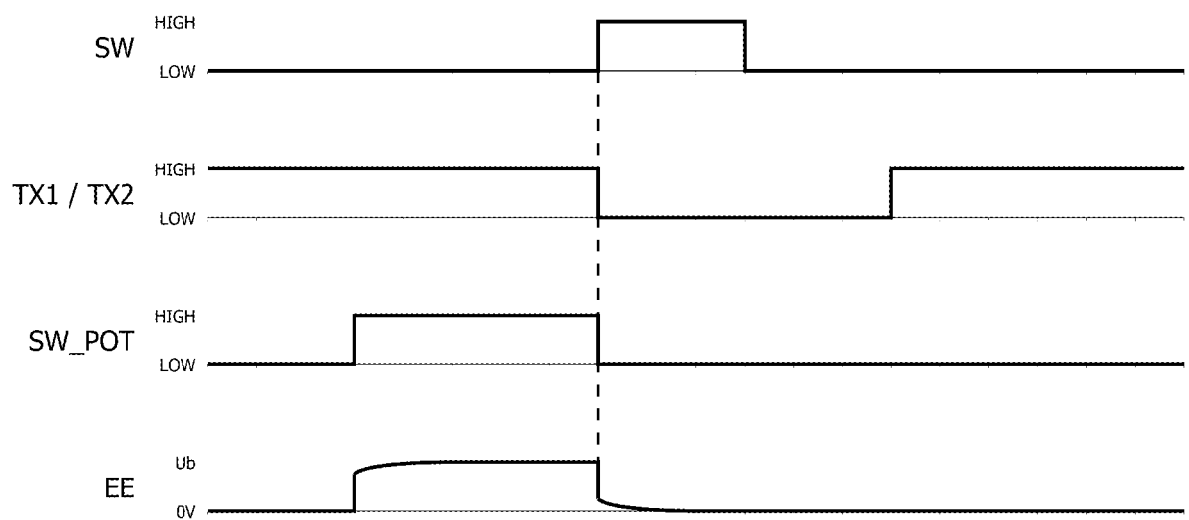
FIG. 7 shows the timing diagram for a ground-related capacitance measurement with negative TX polarity.

The measurement is as follows:
switching output of the transmitter (TX1 and/or TX2) is LOW,
reference potential switching output (SW_POT) is LOW, control signal (SW) for the switch (S1) is LOW,
reference potential switching output (SW_POT) switches to HIGH,
reference potential switching output (SW_POT) switches to LOW and the control signal (SW) for the switch (S1) switches to HIGH,
the control signal (SW) for the switch (S1) switches to LOW, FIG. 7 shows the timing diagram of another operating mode relating to the ground-related capacitance measurement (C-GND). The TX signal is active with respect to FIG. 6 with a negative switching edge and can therefore be advantageously used to control an auxiliary electrode for further field-influencing.

The measurement is as follows:
switching output of the transmitter (TX1 and/or TX2) is HIGH,
reference potential switching output (SW_POT) is LOW, control signal (SW) for the switch (S1) is LOW,
reference potential switching output (SW_POT) switches to HIGH,
reference potential switching output (SW_POT) switches to LOW and the control signal (SW) for the switch (S1) switches to HIGH, and the switch output of the transmitter (TX1 and/or TX2) switches to LOW
the control signal (SW) for the switch (S1) switches to LOW,
switching output of the transmitter (TX1 and/or TX2) switches to HIGH.

Figure 8:
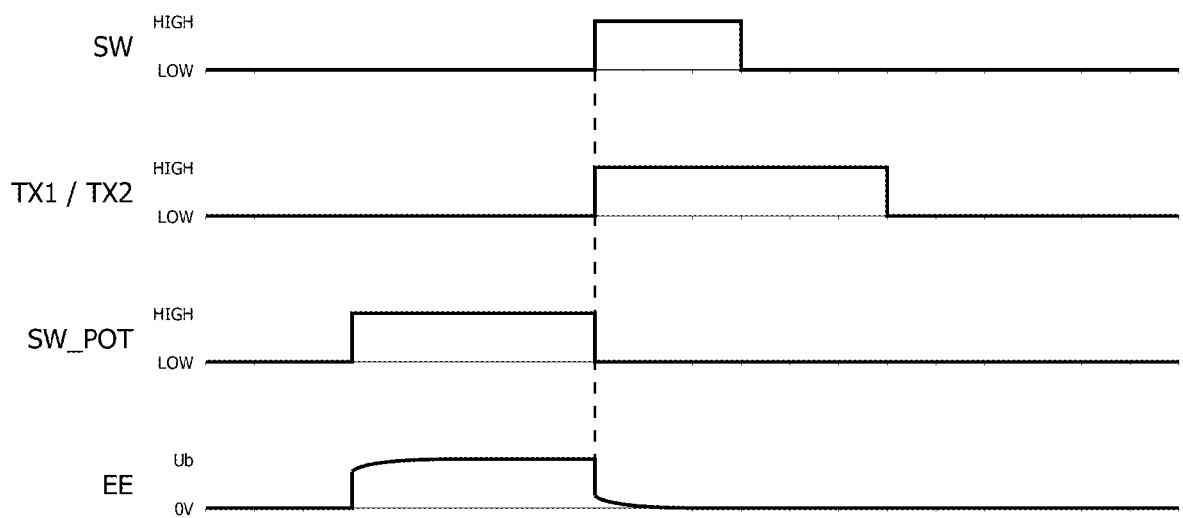
FIG. 8 shows the timing diagram for a ground-related capacitance measurement with positive TX polarity.

FIG. 8 shows the timing diagram of another operating mode relating to the ground-related capacitance measurement (C-GND). The TX signal has the opposite polarity with respect to FIG. 7. Both operating modes can advantageously be carried out directly one after the other in order to suppress undesired influencing factors, such as offset errors, by subtraction.

In the operating modes according to FIGS. 2 to 5, which operate according to the transmission-reception principle, the charge transport is restricted to the current path from the transmission electrodes SE1 or SE2 to the reception electrode EE by permanently maintaining the reference potential switching output SW_POT at 0 volts (ground) so that the capacitance of the reception electrode EE against ground can not contribute to the measurement result.

In the operating modes according to FIGS. 6 to 8, the charge transport occurs from ground (0 volts) to the reception electrode EE, wherein the reference potential switching output SW_POT actively controls the reference potential of the receiver input EA. The transmission electrodes SE1 and SE2 are usually permanently held at ground (0 volts), but can also be actively controlled to additionally influence the charge transport.

All operating modes can be operated both without active transmission electrodes SE1, SE2 and with a plurality of simultaneously active transmission electrodes SE1, SE2 whose TX edges can optionally have the same or opposite polarities.

What is claimed is:

1. A capacitive door handle sensor comprising at least one transmission electrode and one reception electrode, an operational amplifier configured as a charge amplifier and connected to the reception electrode, a switch for charge transfer, a first and a second switch for discharging the two operational amplifier inputs, a capacitor arranged between an output and an inverting input of the operational amplifier, and a control unit for controlling and evaluating a capacitance measurement, wherein
the control unit comprises a reference potential switching output connected to a control terminal of the switch, which is configured to control the capacitance measurement between the at least one transmission electrode and the reception electrode or between the reception electrode and ground.

2. A method for setting a transmission-related operating mode for the capacitive door handle sensor according to claim 1, comprising a measurement as follows:
a switching output of the control unit, for the at least one transmission electrode, is LOW,
the reference potential switching output is LOW,
a control signal for the switch is LOW,
the control signal for the switch switches to HIGH,
an expiration of a delay time of an RC element of a receiver input,
the switching output of the control unit, for the at least one transmission electrode, switches to HIGH,
the control signal for the switch switches to LOW,
the switching output of the control unit, for the at least one transmission electrode, switches to LOW.

3. A method for setting a transmission-related operating mode for the capacitive door handle sensor according to claim 1, comprising a measurement as follows:
a switching output of the control unit, for the at least one transmission electrode, is HIGH,
the reference potential switching output is LOW,
a control signal for the switch is LOW,
the control signal for the switch switches to HIGH,
an expiration of a delay time of an RC element of a receiver input,
the switching output of the control unit, for the at least one transmission electrode, switches to LOW,
the control signal for the switch switches to LOW,
the switching output of the control unit, for the at least one transmission electrode, switches to HIGH.

4. A method for setting a transmission-related operating mode for the capacitive door handle sensor according to claim 1, comprising a measurement as follows:
a switching output of the control unit, for a first transmission electrode, is LOW,
and the switching output of the control unit, for a second transmission electrode, is HIGH
the reference potential switching output is LOW,
a control signal for the switch is LOW,
the control signal for the switch switches to HIGH,
an expiration of a delay time of an RC element of a receiver input, the switching output of the control unit, for the first transmission electrode, switches to HIGH and the switching output of the control unit, for the second transmission electrode, switches to LOW, the control signal for the switch switches to LOW, the switching output of the control unit, for the first transmission electrode, switches to LOW and the switching output of the control unit, for the second transmission electrode, switches to HIGH.

5. A method for setting a transmission-related operating mode for the capacitive door handle sensor according to claim 1, comprising a measurement as follows:

a switching output of the control unit, for the at least one transmission electrode, is LOW, the reference potential switching output is LOW, a control signal for the switch is LOW, the control signal for the switch switches to HIGH and the switching output of the control unit, for the at least one transmission electrode, switches to HIGH, the control signal for the switch switches to LOW, the switching output of the control unit, for the at least one transmission electrode, switches to LOW.

6. A method for setting a transmission-related operating mode for the capacitive door handle sensor according to claim 1, comprising a measurement as follows:

a switching output of the control unit, for the at least one transmission electrode, is HIGH, the reference potential switching output is LOW, a control signal for the switch is LOW, the control signal for the switch switches to HIGH and the switching output of the control unit, for the at least one transmission electrode, switches to LOW, the control signal for the switch switches to LOW, the switching output of the control unit, for the at least one transmission electrode, switches to HIGH.

7. A method for setting a transmission-related operating mode for the capacitive door handle sensor according to claim 1, comprising a measurement as follows:

a switching output of the control unit, for a first transmission electrode, is LOW and the switching output of the control unit, for a second transmission electrode, is HIGH, the reference potential switching output is LOW, a control signal for the switch is LOW, the control signal for the switch switches to HIGH and the switching output of the control unit, for the first transmission electrode, switches to HIGH and the switching output of the control unit, for the second transmission electrode, switches to LOW, the control signal for the switch switches to LOW, the switching output of the control unit, for the first transmission electrode, switches to LOW and the switching output of the control unit, for the second transmission electrode, switches to HIGH.

8. A method for setting a ground-related operating mode for the capacitive door handle sensor according to claim 1, comprising a measurement as follows:

a switching output of the control unit, for the at least one transmission electrode, is LOW, the reference potential switching output is LOW, a control signal for the switch is LOW, the reference potential switching output switches to HIGH, the reference potential switching output switches to LOW and the control signal for the switch switches to HIGH, the control signal for the switch switches to LOW.

9. A method for setting a ground-related operating mode for the capacitive door handle sensor according to claim 1, comprising a measurement as follows:

a switching output of the control unit, for the at least one transmission electrode, is at an output state HIGH or LOW, the reference potential switching output is LOW, a control signal for the switch is LOW, the reference potential switching output switches to HIGH, the reference potential switching output switches to LOW and the control signal for the switch switches to HIGH and the switching output of the control unit, for the at least one transmission electrode, switches to the state which is inverse with respect to the state LOW or HIGH, the control signal for the switch switches to LOW, the switching output of the control unit, for the at least one transmission electrode, returns to its initial state HIGH or LOW.

10. A method for setting a ground-related operating mode for the capacitive door handle sensor according to claim 1, comprising a measurement as follows:

a switching output of the control unit, for a first transmission electrode, is LOW and a switching output of the control unit, for a second transmission electrode, is HIGH, the reference potential switching output is LOW, a control signal for the switch is LOW, the reference potential switching output switches to HIGH, the reference potential switching output switches to LOW and the control signal for the switch switches to HIGH and the switching output of the control unit, for the first transmission electrode, switches to HIGH and the switching output of the control unit, for the second transmission electrode, switches to LOW, the control signal for the switch switches to LOW, the switching output of the control unit, for the first transmission electrode, switches to LOW and the switching output of the control unit, for the second transmission electrode, switches to HIGH.

* * * * *